United States Patent
Clevenger et al.

(10) Patent No.: US 7,088,074 B2
(45) Date of Patent: Aug. 8, 2006

(54) SYSTEM LEVEL DEVICE FOR BATTERY AND INTEGRATED CIRCUIT INTEGRATION

(75) Inventors: Lawrence A. Clevenger, LaGrangeville, NY (US); Louis L. Hsu, Fishkill, NY (US); Carl J. Radens, LaGrangeville, NY (US); Li-Kong Wang, Montvale, NJ (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 10/039,541

(22) Filed: Jan. 2, 2002

(65) Prior Publication Data

US 2003/0122522 A1 Jul. 3, 2003

(51) Int. Cl.
*H02J 7/00* (2006.01)

(52) U.S. Cl. ......................... 320/107; 257/690
(58) Field of Classification Search ............... 320/107, 320/112; 365/229, 228; 429/123; 439/68, 439/69, 70, 7, 72, 731; 437/209, 214, 220; 257/528, 678, 679, 685, 686, 690, 723, 724, 257/726, 727, 777, 778, 785
See application file for complete search history.

(56) References Cited

U.S. PATENT DOCUMENTS

| | | | | |
|---|---|---|---|---|
| 4,026,304 A | * | 5/1977 | Levy ........................... 607/51 |
| 4,381,458 A | * | 4/1983 | Anstey et al. ................. 307/66 |
| 4,633,239 A | * | 12/1986 | Nalbanti ................... 340/636.1 |
| 4,645,943 A | * | 2/1987 | Smith et al. ................. 307/150 |
| 4,998,888 A | * | 3/1991 | Link et al. ..................... 439/73 |
| 5,119,269 A | * | 6/1992 | Nakayama .................... 361/380 |
| 5,451,715 A | * | 9/1995 | Hundt et al. ................. 174/52.4 |
| 5,498,903 A | * | 3/1996 | Dixon et al. ................. 257/690 |
| 5,540,379 A | * | 7/1996 | Kazem-Goudarzi et al. ........................ 228/248.5 |
| 5,615,250 A | * | 3/1997 | Kobayashi ................... 455/558 |
| 5,673,028 A | * | 9/1997 | Levy ........................... 340/635 |
| 5,724,728 A | * | 3/1998 | Bond et al. .................... 29/840 |
| 5,779,839 A | * | 7/1998 | Tuttle et al. ................. 156/213 |
| 5,787,174 A | * | 7/1998 | Tuttle ........................ 713/189 |
| 5,882,106 A | * | 3/1999 | Galli ........................... 362/259 |
| 5,963,429 A | * | 10/1999 | Chen ........................... 361/764 |
| 6,020,634 A | * | 2/2000 | Gerber et al. ............... 257/726 |
| 6,085,342 A | * | 7/2000 | Marholev et al. ........... 714/724 |

(Continued)

FOREIGN PATENT DOCUMENTS

| | | | |
|---|---|---|---|
| DE | 19612718 A1 | * | 10/1997 |
| FR | 2822572 A1 | * | 9/2002 |
| JP | 02001015673 A | * | 1/2001 |

*Primary Examiner*—Donald Sparks
*Assistant Examiner*—Lawrence Luk
(74) *Attorney, Agent, or Firm*—Gibb I.P. Law Firm, LLC; Robert M. Trepp, Esq.

(57) ABSTRACT

A system level device for battery and integrated circuit chip integration comprises at least one battery; at least one integrated circuit chip powered by the at least one battery; and a package connected to any of the at least one battery and the at least one integrated circuit chip, wherein the at least one battery connects to a pair of opposed upright ends of the package, wherein the at least one integrated circuit chip is disposed between the at least one battery and the package, and wherein the at least one integrated circuit chip lays on top of a portion of the package.

20 Claims, 3 Drawing Sheets

U.S. PATENT DOCUMENTS

| | | | |
|---|---|---|---|
| 6,206,705 B1 * | 3/2001 | Bolotin et al. | 439/69 |
| 6,278,264 B1 * | 8/2001 | Burstein et al. | 323/282 |
| 6,459,593 B1 * | 10/2002 | Kwong | 361/761 |
| 6,548,207 B1 * | 4/2003 | Tuttle | 429/158 |
| 6,673,484 B1 * | 1/2004 | Matsuura | 429/96 |
| 6,906,407 B1 * | 6/2005 | Byers et al. | 257/686 |

\* cited by examiner

SYSTEM LEVEL DEVICE FOR BATTERY AND INTEGRATED CIRCUIT INTEGRATION

BACKGROUND OF THE INVENTION

1. Field of the Invention

The present invention generally relates to power supply units for electronic and computing systems, and more particularly to a system level power source integration to support handheld devices, computer systems, and other electronic equipment 2. Description of the Related Art In today's wireless systems and personal systems continuous supply of power to maintain the quality of service becomes a major challenge. Using a battery to support the system usage becomes the primary operation mode in those systems. Although there are many new developments in the battery technology for longer usage period, lifetime, and operating environment, the integration of a battery into a system is proving to be bulky and inconvenient.

Currently, a battery management system is provided for very complex electrical and electronic-based circuits or devices, such as laptop computers, which typically utilize rechargeable batteries. In these applications, the battery management system typically provides a specialized serial interface, such as the SMBus, for interfacing with an external controller such as a micro-controller. These battery management systems consist of specialized circuitry which is optimized for the unique chemistry of the specific battery type being monitored and controlled (i.e., nickel cadmium, lithium, etc.).

A number of advanced battery technologies have recently been developed, such as metal hydride (e.g., Ni-MH), lithium-ion, and lithium polymer cell technologies, which would appear to provide the requisite level of energy production and safety margins for many commercial and consumer applications. However, such advanced battery technologies often exhibit characteristics that provide challenges for the designers and manufacturers of advanced energy storage devices.

Moreover, in recent years, there has been accelerated development of down-sized and cordless design schemes in the field of electronics apparatus or equipment. In view of this trend, batteries and battery systems are of increasing interest since these have increased applicability as the power supply for such electronic equipment due to their capability of size reduction and high electrical energy density.

These battery management systems and the associated microcontroller utilize current or voltage level monitoring techniques to switch between battery sources and/or to shut down the device being powered at a battery discharge level that is controlled by data stored in the memory. As such, current battery management systems are vastly complex and cost significantly greater than what can be justified for cheaper devices.

Additionally, the demand for new and improved electronic and electro-mechanical systems have placed increased pressure on the designers and manufacturers of energy storage devices to develop battery technologies that provide for high energy generation in a low-volume package. Conventional battery systems, such as those that utilize lead acid for example, are often unsuitable for use in high-power, low-weight applications. Other known battery technologies may be considered too unstable or hazardous for use in consumer product applications, such as portable wireless devices.

In accordance with a conventional advanced battery design, individual cells are hardwired together and to the positive and negative power terminals of the battery. Various electronic components which may be incorporated into the battery design must also be hardwired to the cells. It should be apparent to those skilled in the art that such conventional interconnection approaches provide for little, if any, flexibility when attempting to alter the series and/or parallel hardwired connections between the cells and components.

Moreover, the wiring process typically employed in the fabrication of conventional advanced batteries is generally complicated and time consuming. Of particular concern to the designers and manufacturers of conventional advanced batteries are the unintentional wiring shorts, which develop during the wiring process. These and other design defects typically result in a reduction in the performance and service life of the battery, and often represent a significant safety concern.

Other characteristics of advanced battery technologies provide additional challenges for the designers of advanced energy storage devices. For example, certain advanced cell structures are subject to cyclical changes in volume as a consequence of variations in the state of charge of the cell. The total volume of such a cell may vary as much as five to six percent during charge and discharge cycling. Such repetitive changes in the physical size of a cell significantly complicates the mechanical housing design and electrical connection strategy. The electrochemical, thermal, and mechanical characteristics of an advanced battery cell must typically be well understood and appropriately considered when designing an energy storage system suitable for use in commercial and consumer devices and systems.

However, there remains a need for an integrated solution of chips and packaging as a new concept for the power source at the chip packaging and system level. Moreover, there is a need for a system level self-powered system, which provides flexibility and reliability, and which can be manufactured easily and at a lower cost than conventional systems.

SUMMARY OF THE INVENTION

In view of the foregoing and other problems, disadvantages, and drawbacks of the conventional power source system units the present invention has been devised, and it is an object of the present invention to provide a structure and method for an integrated solution of chips and packaging as a new concept for the power source at the chip packaging and system level.

A system level device for battery and integrated circuit chip integration comprising at least one battery; at least one integrated circuit chip powered by the at least one battery; and a package having a pair of opposed upright ends, the package connected to any of the at least one battery and the at least one integrated circuit chip, wherein the at least one integrated circuit chip may lay on top of a portion of the package, wherein the at least one battery may overhang the at least one integrated circuit chip, wherein the package may connect to the at least one integrated circuit chip through an interior portion of the package, wherein the at least one integrated circuit chip may connect to an upper indent portion of the package, wherein the at least one battery is preferably larger than the at least one integrated circuit chip, wherein the at least one battery preferably connects to an underside of the package, and wherein the at least one battery may further comprise a stack of connected batteries.

Another aspect of the invention provides a system level device for battery and integrated circuit chip integration comprising at least one battery; at least one integrated circuit chip powered by the at least one battery; and a package connected to any of the at least one battery and the at least one integrated circuit chip, wherein the at least one battery connects to a pair of opposed upright ends of the package, wherein the at least one integrated circuit chip is preferably disposed between the at least one battery and the package, and wherein the at least one integrated circuit chip preferably lays on top of a portion of the package.

Another embodiment of the invention provides a system level device for battery and integrated circuit chip integration comprising a multi-chip module integration system, wherein the multi-chip module integration system comprises a multi-chip module having a pair of opposed upright ends; at least one battery connected to the multi-chip module; and at least one integrated circuit chip connected to the battery, wherein the integrated circuit chip is powered by the battery, wherein the at least one battery preferably overhangs, and is larger than, the at least one integrated circuit chip, wherein the at least one integrated circuit chip lays on top of a portion of the multi-chip module, wherein the multi-chip module may connect to the at least one integrated circuit chip through an interior portion of the multi-chip module, and wherein the at least one integrated circuit chip may connect to an upper indent portion of the multi-chip module.

Another aspect of the invention provides a system level device for battery and integrated circuit chip integration comprising a multi-chip module integration system, wherein the multi-chip module integration system comprises a multi-chip module; at least one battery connected to the multi-chip module; and at least one integrated circuit chip-connected to the-battery, wherein the integrated circuit chip is powered by the battery, wherein the at least one battery preferably connects to a pair of opposed upright ends of the multi-chip module, wherein the at least one battery preferably overhangs; and is larger than, the at least one integrated circuit chip, and wherein the at least one integrated circuit chip may lay on top of a portion of the multi-chip module.

Another embodiment of the invention provides an integrated chip structure comprising an integrated circuit chip; a battery directly connected to the integrated circuit chip; and a package having a pair of opposed upright ends, the package connected to any of the battery and the integrated circuit chip, wherein the integrated circuit chip preferably lays on top of a portion of the package, and wherein the at least one battery preferably overhangs the at least one integrated circuit chip. Preferably, the integrated chip structure further comprises solder connections between the battery and the integrated circuit chip, wherein the solder connections may comprise an electrical connection between the battery and the integrated circuit chip, wherein the package preferably surrounds the battery and the integrated circuit chip, and wherein the battery is preferably directly connected to the package.

Another embodiment of the invention provides an integrated chip structure comprising a package having a pair of opposed upright ends; an integrated circuit chip mounted on the package; a battery directly connected to the package arid electrically connected to the integrated circuit chip, wherein the integrated circuit chip preferably lays on top of a portion of the package, wherein the at least one battery may overhang the at least one integrated circuit chip, wherein the battery is preferably held adjacent in the integrated circuit chip by the package, wherein the package may be between the battery and the integrated circuit chip, wherein the battery is preferably electrically connected the integrated circuit chip through the package, and wherein the battery may comprise multiple batteries stacked on the package.

There are numerous benefits of the integration of chips and a battery, according to the present invention. For example, the present invention greatly reduces the overall system size. Second, the present invention improves the power supply efficiency, since the battery chip is located very close to the system. Hence, the energy waste due to resistive loss caused by having a power supply through a long resistive power bus, is eliminated. Another advantage is that power management becomes easier, since the battery chip includes battery cell arrays in addition to relevant control circuitry. Yet another benefit is the noise due to the power supply is reduced by reducing the wire inductance. Moreover, the present invention allows for decoupling capacitors and regulators to be added, which can also be integrated on the battery chip to manage the noise. Still another advantage of the present invention is that the thermal effect caused by the battery charging and discharging is minimized. Along these lines, by reducing battery heat-up during charging, the battery life span is increased, and the charging efficiency is greatly improved.

BRIEF DESCRIPTION OF THE DRAWINGS

The foregoing and other objects, aspects and advantages will be better understood from the following detailed description of the preferred embodiments of the invention with reference to the drawings, in which:

FIG. 2(*b*) is a schematic diagram of a third embodiment of a battery and chip packaging system;

FIG. 2(*c*) is a schematic diagram of a fourth embodiment of a battery and chip packaging system;

DETAILED DESCRIPTION OF PREFERRED EMBODIMENTS OF THE INVENTION

As previously mentioned, there is a need for an integrated solution of chips and packaging as a new concept for the power source at the chip packaging and system level, and for a system level self-powered system, which provides flexibility and reliability, and which can be manufactured easily and at a lower cost than conventional systems. The invention addresses these needs by providing solutions of on-chip solid-state battery technology and power system for on-chip batteries. The present invention further provides for the integration of other battery types (other than solid-state batteries). The present invention uses packaging technology, wherein the solid-state battery can be fabricated independently and packaged to the chip or package.

Figure 1:
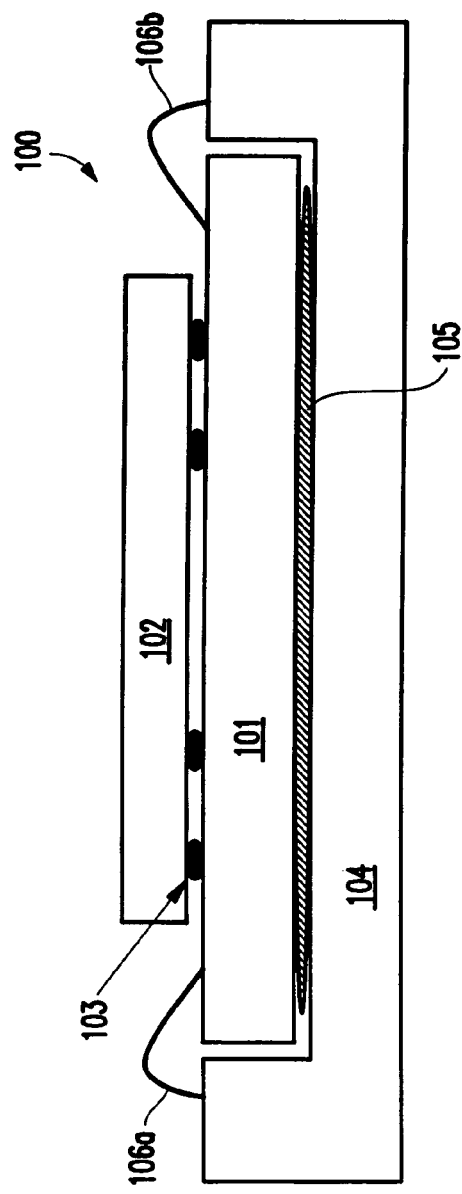
FIG. 1 is a schematic diagram of a first embodiment of an integrated battery and chip packaging system.

Referring now to the drawings, and more particularly to FIGS. 1 through 4, there are shown preferred embodiments of the method and structures according to the present invention. In FIG. 1, a schematic diagram of a first embodiment of an integrated solid-state battery and chip packaging system 100 is illustrated with a solid-state battery 102 shown on a finished chip 101. The solid-state battery chip (e.g., capacitor, etc.) 102 is soldered to the underside of a chip further comprising an integrated circuit 101. The battery electrodes 103 can be soldered to the chip through a micro-C4 or similar technique to the chip voltage sources. Then the entire stacked chips can be placed into a standard package 104. Since the battery chip 102 is placed in the middle of the chip 101, this structure is more ideal for the chip having low number of input and output (I/O) pins 103 and does not require a full chip size battery. To add extra power capability, a larger size battery is usually required.

The advantages of this embodiment are that the battery is directly attached to the silicon chip by using soldering techniques. Moreover, this embodiment produces the lowest resistance and inductance between the battery terminals and chip power supply pads, thus the noise generated by inductance is minimized and the resistance loss of the power supply current is minimized. The shaded area 105 between the chip 101 and the packaging 104 is the backside attachment of the chip 101, which can be either conductive or non-conductive. The two wires 106a, 106b are the wires bonded to the bonding pads (not shown) on the chip periphery 101. Since the chip 101 is placed facing upward, the on-chip battery 102 covers the center of the chip 101. Moreover, the input/output pads 103 are connected to the packaging through the wires 106a, 106b.

Figure 2A:
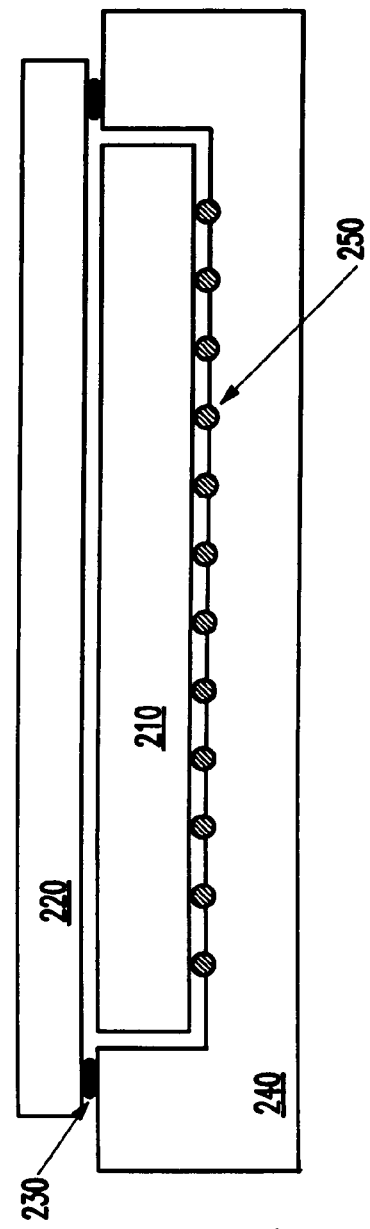
FIG. 2(*a*) is a schematic diagram of a second embodiment of a battery and chip packaging system.
Figure 2B:
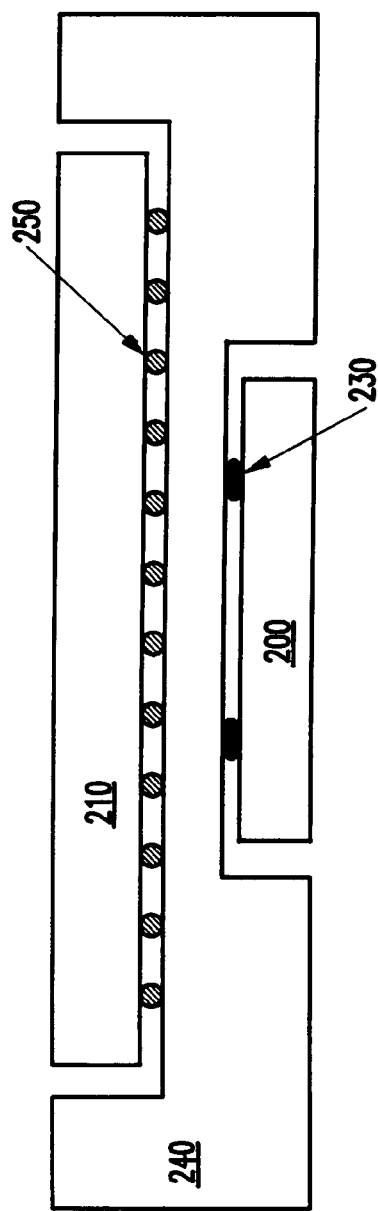
Figure 2C:
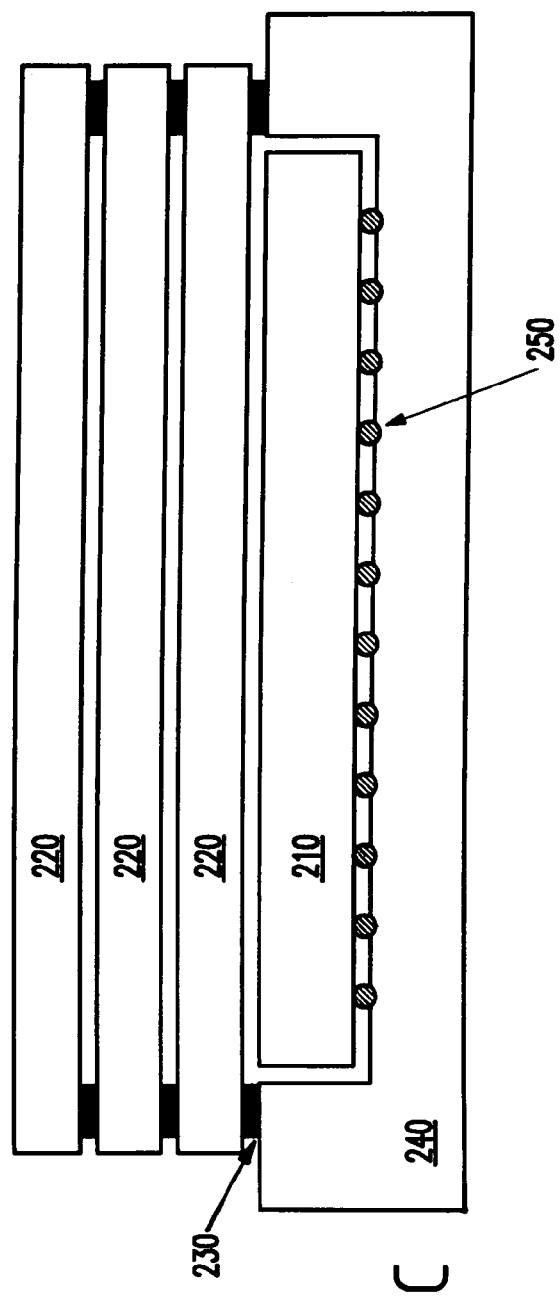

In FIGS. 2(*a*) through 2(*c*) several other embodiments are shown. As such, several methods exist to place the battery into the chip package as an integrated part of the chip packaging. In FIG. 2(*a*) a solid-state battery 220 with a size larger than the integrated circuit chip 210 is placed over the rim of the package 240 with power supply and ground electrodes 230 contacting the package 240 directly.

In this second embodiment, the chip packaging is the same as the regular packaging method. There are several soldering bumps 250 for the silicon chip input and output pins. Some of the I/O pins are power/ground pins. The connections 250 to the chip 210 are through the packaging interior 240. The battery power and ground are fed through the packaging structure to the power/ground pins. Although, this structure has a reduced resistance and inductance compared to a conventional system, it has a slightly higher resistance and inductance compared to the first embodiment since the power and ground wires are of finite length in the packaging. However, for chips with a large number of I/O, such as microprocessors, this is a preferred embodiment because there is no blockage from the battery. The embodiment shown in FIG. 2(*a*) is different from the embodiment shown in FIG. 1 in that the chip 210 is facing downward and connected to the packaging 240 through soldering balls 250. Here, the battery 220 is behind the chip 210 and can only be connected to the chip power electrodes 230 through the packaging 240.

In FIG. 2(*b*), a third embodiment illustrating a different mode of packaging is shown, wherein the solid-state battery 220 is placed over the opposite side of the packaging 240 with power supply and ground electrodes 230 contacting the package 240 directly. The connections 250 to the chip 210 are through the packaging interior 240. This embodiment provides a better connection between the battery electrodes to the packaging in comparison to the second embodiment shown in FIG. 2(*a*). In the second embodiment, the battery to packaging connection is alone in the rim of the package, which can increase the path of the power and ground lines. Also, the size of the contacts between the battery and package is limited by the width of the rim. Conversely, in this third embodiment, the connection wire from the battery can be fed through the package and connect to the chip.

In FIG. 2(*c*), a fourth embodiment of packaging is disclosed. Here, the package is similar to the second embodiment shown in FIG. 2(*a*). However, in the fourth embodiment, several solid-state batteries 220 are stacked to increase the capacity and prolong the usage period. Using a larger battery instead of several stacked batteries can also be suitable if the solid-state battery can be fabricated into the multi-level structure. The solid-state battery is based on the area of cells with temperature and charge/discharge control circuit. Usually, it is fabricated in a thin layer form. However, a large battery with several layers can also be used. Because these solid-state batteries 220 are connected to each other through a low temperature soldering technique, the number of batteries in the stack is flexible. The biggest advantage of the fourth embodiment is the increase in battery lifetime and reduction of the resistance/inductance inside the packaging.

Figure 3:
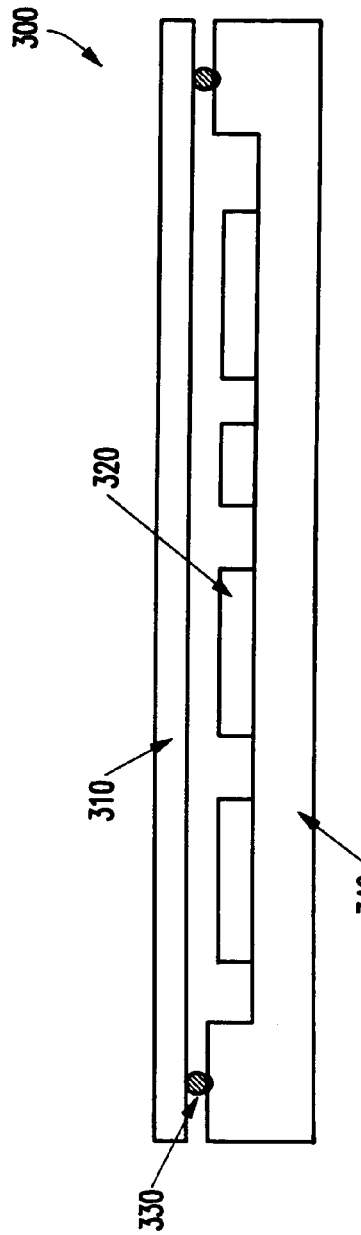
FIG. 3 is a schematic diagram of a fifth embodiment of a battery and chip packaging system illustrating a sub-system level integration of a battery system.

In FIG. 3, a fifth embodiment is shown, wherein a sub-system 300 is disclosed with several chips 320 packaged in a multi-chip-module (MCM) 340. The chips 320 are powered by a large full MCM size solid-state battery 310. The battery 310 becomes the power source for the entire system. The sub-system 300 may content several chips 320 as part of the complete system 300. Moreover, the packaging can be a MCM type of structure. A larger size battery is preferably used, but is not necessary. Rather, the choice depends on the type of chips in this system and the power consumption of these chips. This embodiment constitutes the preferred embodiment of the present invention. In a conventional system, the MCM, which contains several chips to form a sub-system, must be packaged to a board to get power. Thus, in the conventional systems, the benefit of data and signal integration is not available to the supply lines.

Therefore, in the preferred embodiment, the size of the system is reduced because of the elimination of a large number of wires in the packaging levels; instead the wires are in the MCM level. Moreover, the noise, power, and speed are greatly improved. Also, in the preferred embodiment, the battery 310 is included into the MCM module 340 to integrate the power supply into the sub-system 300. This integrated system 300 can be operated by itself as a small system, for example, such as a cellular phone, PDA, etc., or combined with other components within a large system. Furthermore, the battery 310 within the sub-system 300 can serve as a backup power supply to preserve the data and processing activity during power down mode. The preferred embodiment is convenient for smaller systems such as a wireless handset, personal systems, and digital player machines.

The advantages of the integration of chips and a battery (chip), according to the present invention, are several. For example, the present invention greatly reduces the overall system size. Second, the present invention improves the power supply efficiency, since the battery chip is located very close to the system. Hence, the energy waste due to loss and thermal dissipation, caused by having a power supply through a long resistive power bus, is eliminated. Another advantage is that power management becomes easier, since the battery chip includes battery cell arrays in addition to relevant control circuitry.

Yet another benefit is the noise, due to the power supply, is reduced. Moreover, the present invention allows for decoupling capacitors and regulators to be added, which can also be integrated on the battery chip to manage the noise. Still another advantage of the present invention is that the thermal effect caused by the battery charging and discharging is minimized The thermal effect is minimized by integrating the battery controller and voltage regulator into the packaging instead of using an external chip. Moreover, the temperature control to operate the battery is more efficient. Along these lines, by reducing battery heat-up during charging, the battery life span is increased, and the charging efficiency is greatly improved.

Figure 4:
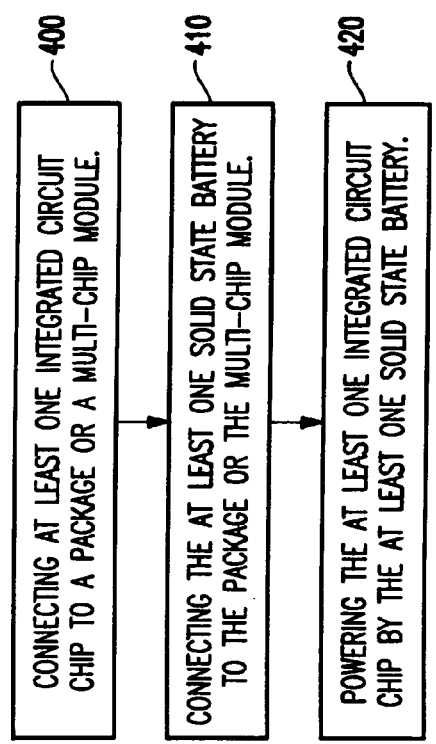
FIG. 4 is a flow diagram illustrating a preferred method of the invention.

FIG. 4 depicts a flow diagram illustrating a preferred method of the invention comprising the steps of connecting 400 at least one integrated circuit chip 210, 320 to a package 240 or a multi-chip module 340. Next, the at least one solid state battery 220, 310 is connected 410 to the package 240 or the multi-chip module 340. Finally, the at least one integrated circuit chip 210, 320 is powered 420 by the at least one solid state battery 220, 310.

While the invention has been described in terms of preferred embodiments, those skilled in the art will recognize that the invention can be practiced with modification within the spirit and scope of the appended claims.

What is claimed is:

1. A system level device for battery and integrated circuit chip integration comprising:
   at least one solid state battery comprising battery cell arrays and control circuitry;
   at least one integrated circuit chip powered by said at least one solid state battery; and
   a package having a pair of opposed upright ends, said package connected to any of said at least one solid state battery and said at least one integrated circuit chip,
   wherein said pair of opposed upright ends comprise a first end having a first upper surface and a second end having a second upper surface, wherein the first and second surfaces are substantially planar to one another,
   wherein said at least one integrated circuit chip lays on top of a portion of said package, and
   wherein said at least one solid state battery overhangs said at least one integrated circuit chip.

2. The device of claim 1, wherein said package connects to said at least one integrated circuit chip through an interior portion of said package.

3. The device of claim 1, wherein said at least one integrated circuit chip connects to an upper indent portion of said package, wherein said at least one solid state battery is larger than said at least one integrated circuit chip.

4. The device of claim 3, wherein said at least one solid state battery further comprises a stack of connected solid state batteries.

5. The device of claim 1, wherein said at least one solid state battery connects to an underside of said package.

6. A system level device for battery and integrated circuit chip integration comprising:
   at least one solid state battery comprising battery cell arrays and control circuitry;
   at least one integrated circuit chip powered by said at least one solid state battery; and
   a package connected to any of said at least one solid state battery and said at least one integrated circuit chip,
   wherein said at least one solid state battery connects to a pair of opposed upright ends of said package,
   wherein said pair of opposed upright ends comprise a first end having a first upper surface and a second end having a second upper surface, wherein the first and second surfaces are substantially planar to one another,
   wherein said at least one integrated circuit chip is disposed between said at least one solid state battery and said package, and
   wherein said at least one integrated circuit chip lays on top of a portion of said package.

7. A system level device for battery and integrated circuit chip integration comprising a multi-chip module integration system, wherein said multi-chip module integration system comprises:
   a multi-chip module having a pair of opposed upright ends;
   at least one solid state battery comprising battery cell arrays and control circuitry, said at least one solid state battery connected to said multi-chip module; and
   at least one integrated circuit chip connected to said at least one solid state battery, wherein said integrated circuit chip is powered by said at least one solid state battery, and wherein said at least one solid state battery overhangs, and is larger than, said at least one integrated circuit chip,
   wherein said pair of opposed upright ends comprise a first end having a first upper surface and a second end having a second upper surface, wherein the first and second surfaces are substantially planar to one another,
   wherein said at least one integrated circuit chip lays on top of a portion of said multi-chip module.

8. The system of claim 7, wherein said multi-chip module connects to said at least one integrated circuit chip through an interior portion of said multi-chip module.

9. The system of claim 7, wherein said at least one integrated circuit chip connects to an upper indent portion of said multi-chip module.

10. A system level device for battery and integrated circuit chip integration comprising a multi-chip module integration system, wherein said multi-chip module integration system comprises:
    a multi-chip module;
    at least one solid state battery comprising battery cell arrays and control circuitry, said at least one solid state battery connected to said multi-chip module; and
    at least one integrated circuit chip connected to said at least one solid state battery,
    wherein said integrated circuit chip is powered by said at least one solid state battery,
    wherein said at least one solid state battery connects to a pair of opposed upright ends of said multi-chip module,
    wherein said pair of opposed upright ends comprise a first end having a first upper surface and a second end having a second upper surface, wherein the first and second surfaces are substantially planar to one another,
    wherein said at least one solid state battery overhangs, and is larger than, said at least one integrated circuit chip, and
    wherein said at least one integrated circuit chip lays on top of a portion of said multi-chip module.

11. An integrated chip structure comprising:
    an integrated circuit chip;
    a solid state battery comprising battery cell arrays and control circuitry, said at least one solid state battery directly connected to said integrated circuit chip; and
    a package having a pair of opposed upright ends, said package connected to any of said solid state battery and said integrated circuit chip,
    wherein an upper surface of said pair of opposed upright ends is planar with an upper surface of said integrated circuit chip,
    wherein said integrated circuit chip lays on top of a portion of said package, and
    wherein said solid state battery overhangs said at least one integrated circuit chip.

12. The structure in claim 11, further comprising solder connections between said solid state battery and said integrated circuit chip.

13. The structure in claim 12, wherein said solder connections comprise an electrical connection between said solid state battery and said integrated circuit chip.

14. The structure in claim 12, wherein said solid state battery is directly connected to said package.

15. The structure in claim 11, wherein said package surrounds said solid state battery and said integrated circuit chip.

16. An integrated chip structure comprising:
a package having a pair of opposed upright ends;
an integrated circuit chip mounted on said package;
a solid state battery comprising battery cell arrays and control circuitry, said at least one solid state battery directly connected to said package and electrically connected to said integrated circuit chip,
wherein said pair of opposed upright ends comprise a first end having a first upper surface and a second end having a second upper surface, wherein the first and second surfaces are substantially planar to one another,
wherein said integrated circuit chip lays on top of a portion of said package, and
wherein said solid state battery overhangs said at least one integrated circuit chip.

17. The structure in claim 16, wherein said solid state battery is held adjacent to said integrated circuit chip by said package.

18. The structure in claim 16, wherein said package is between said solid state battery and said integrated circuit chip.

19. The structure in claim 16, wherein said solid state battery is electrically connected to said integrated circuit chip through said package.

20. The structure in claim 16, wherein said solid state battery comprises multiple solid state batteries stacked on said package.

* * * * *